United States Patent
Yasuo et al.

(10) Patent No.: US 6,869,718 B2
(45) Date of Patent: Mar. 22, 2005

(54) SEPARATOR USED FOR FUEL CELL, METHOD FOR MANUFACTURING THE SEPARATOR, AND THE FUEL CELL

(75) Inventors: Takashi Yasuo, Ashikaga (JP); Kiyoshi Hori, Nabari (JP); Yoshito Chikano, Ora (JP); Ikuo Yonezu, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 485 days.

(21) Appl. No.: 10/005,466

(22) Filed: Nov. 8, 2001

(65) Prior Publication Data

US 2002/0187379 A1 Dec. 12, 2002

(30) Foreign Application Priority Data

Nov. 9, 2000 (JP) ........................................ 2000-342574

(51) Int. Cl.[7] .............................................. H01M 2/00
(52) U.S. Cl. ............................................ 429/34; 429/38
(58) Field of Search ............................ 429/34, 38

(56) References Cited

U.S. PATENT DOCUMENTS 6,440,598 B1 * 8/2002 Fukui et al. ................... 429/34

FOREIGN PATENT DOCUMENTS

WO   WO 2001/03214   *   1/2001

* cited by examiner

*Primary Examiner*—Laura Weiner
(74) *Attorney, Agent, or Firm*—Merchant & Gould P.C.

(57) ABSTRACT

A fuel cell separator which has a metal substrate and offers a high corrosion resistance and conductivity is provided. The separator has a metal layer on the surface of the substrate made of stainless steel, and a conductive layer on top of the metal layer. The conductive layer is made up of conductive particles which are fusion-bonded to each other and exhibit excellent conductivity. The separator also has a highly corrosion-resisting oxide layer which covers exposed parts of the metal layer, the parts where the metal layer is not covered with the conductive particles. This enables the fuel cell separator to assume high conductivity at an interface between the metal layer and the conductive particles, and high corrosion resistance at the exposed parts of the surface of the metal layer.

16 Claims, 7 Drawing Sheets

SEPARATOR USED FOR FUEL CELL, METHOD FOR MANUFACTURING THE SEPARATOR, AND THE FUEL CELL

This application is based on an application No. 2000-342574 filed in Japan, the content of which is hereby incorporated by reference.

BACKGROUND OF THE INVENTION (1) Field of the Invention

The present invention relates to separators used for fuel cells, a method for manufacturing the same, and fuel cells, and more particularly, to a technology for improving the properties of fuel cell separators that operate at relatively low temperatures, including polymer electrolyte fuel cells (PEFCs).

(2) Description of the Related Art

There are several types of fuel cells, including solid oxide electrolyte fuel cells, molten carbonate fuel cells and PEFCs. Solid oxide electrolyte fuel cells and molten carbonate fuel cells operate at a high temperature of 500° C. or above. PEFCs can operate at a relatively low temperature of 200° C. or below by using a solid polymer film made of an ion-exchange resin as an electrolytic film.

Generally, PEFCs have a multi-layered structure in which a number of cells are stacked one against another, with a pair of conductive plates (hereafter referred to as a separator) interposed therebetween. Each cell has an anode on one surface of a solid polymer film and a cathode on the other surface. Each conductive plate has channels for providing fuels such as hydrogen and oxidizers such as air, and ribs formed between neighboring channels. In such PEFCs with a number of cell stacks, power generation efficiency is greatly affected by performance of the separators.

In general, separators are required to have the following properties; high conductivity (low contact resistance), high corrosion resistance, high hydrophilicity, high mechanical strength (high rigidity) and high formability. Also, separators should be thin, light and impermeable to gas. To meet these requirements to a certain extent, carbon materials have conventionally been used for PEFCs.

Carbon materials, however, are not suitable for the development of fuel cells which are smaller but have a high level of output. Reduction in the size of fuel cells requires reduction in the thickness of separators, but since thinner carbon materials lack sufficient mechanical strength and formability, it is impossible to reduce the thickness of the carbon materials limitlessly. In view of this problem, separators having metal substrates have been developed recently, which offer superior mechanical strength and formability with reduced thickness. However, when separators have metal substrates, there arise problems of corrosion resistance and contact resistance. Since metals in general have a low corrosion resistance, separators are easily corroded by water, which is present under reaction in a conventional fuel cell. In addition, a passive layer formed on the surface of a metal by oxidization raises the contact resistance of the separator, to exceed one using a carbon material. This increases a voltage drop for such metal separator substantially when an electric current is fed, which may lead to degradations in the performance of the fuel cell.

To solve this problem, Japanese Laid-Open Patent Application No. H10-228914 discloses the following technique (hereafter referred to as "first conventional technique"). Stainless steel is employed as a metal for the substrate of the separator, and the surface of the separator is plated with a precious metal, such as gold, platinum, or nickel, that has high corrosion resistance and high conductivity. The stainless steel for the substrate has excellent corrosion resistance. In addition, the surface of the substrate is plated with gold or the like that has excellent corrosion resistance and conductivity. This gives the separator a high corrosion resistance and low contact resistance.

However, the plating may suffer the occurrence of pinholes. When the pinholes occur, it becomes difficult to completely cover the substrate. These pinholes can also act as local batteries, accelerating the corrosion of the separator.

A solution to this problem is proposed by Japanese Laid-Open Patent Application No. 2000-164228 (hereafter referred to as a second conventional technique).

Figure 7:
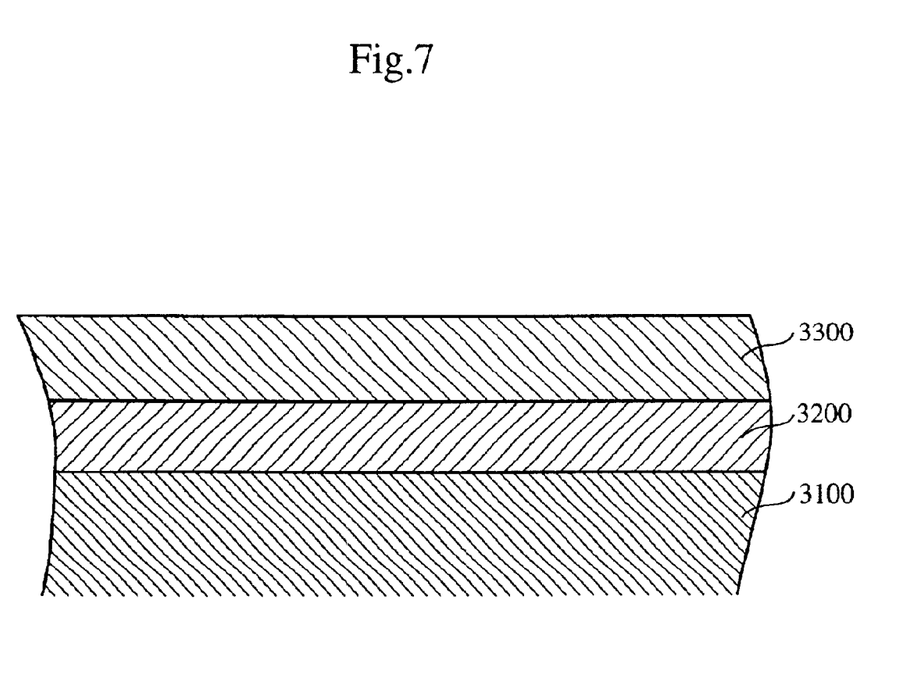
FIG. 7 is a cross-sectional view of a conventional separator.

FIG. 7 is an enlarged cross-sectional view of the fuel cell separator according to the second conventional technique. As shown herein, the fuel cell separator has a multi-layered structure in which a corrosion resistant layer 3200 and a conductive layer 3300 are formed on the surface of a stainless steel substrate 3100. According to this technique, each layer has its own function, which contributes to raising corrosion resistance and lowering contact resistance of the separator.

However, the second conventional technique has a problem that the corrosion resistant layer 3200 provided on the stainless substrate 3100 shows a high electrical resistance, though it has an excellent corrosion resistance. With such highly electrical resisting corrosion resistant layer 3200 interposed between the substrate 3100 and the conductive layer 3300, even when the corrosion resistant layer 3200 is thin, the electrical resistance of the separator in the direction of the thickness will end up being high.

SUMMARY OF THE INVENTION

In view of the above problems, the present invention intends to provide fuel cell separators having high corrosion resistance and high conductivity, fuel cells using such fuel cell separators, and a method for manufacturing a separator for fuel cells.

(Claim 1)

With the stated construction, the separator can, firstly, acquire a wide range of properties, including strength and conductivity, as the metal used for the substrate is different from the metal used for the metal layer. What properties the separator assumes is based on the kind of metal used for the substrate and the metal layer. Secondly, the conductivity of the separator in the direction of the thickness is improved, as, unlike the separator of the second conventional technique, the metal layer is provided in direct contact with the conductive particles without any highly electrical resisting corrosion resistance layer interposed therebetween. Thirdly, the separator has low contact resistance as well as water holding capacity to hold water in spaces among these conductive particles. This is because the porous conductive layer is made up of conductive particles which are fusion-bonded to each other. Finally, the separator has a high corrosion resistance, since the parts of the surface of the metal layer that are not covered with the conductive particles are coated with an oxide film whose corrosion resistance is higher than the substrate. From the above, the separator of the present invention can offer high corrosion resistance, low contact resistance, high conductivity and high water retentivity.

(Claim 2)

(Claims 3, 4)

(Claim 5)
(Claim 6)
(Claim 7)
(Claim 8)
(Claim 9)
(Claim 11)

A separator manufactured according to this method has a low contact resistance, since its metal layer is provided in direct contact with conductive particles. The separator also has high conductivity and high corrosion resistance, because the oxide layer covering the exposed parts of the surface of the metal layer has a higher corrosion resistance than the substrate.

(Claims 12, 13)
(Claim 14)
(Claim 15)
(Claim 16)

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings.

DESCRIPTION OF THE PREFERRED EMBODIMENT

Figure 1:
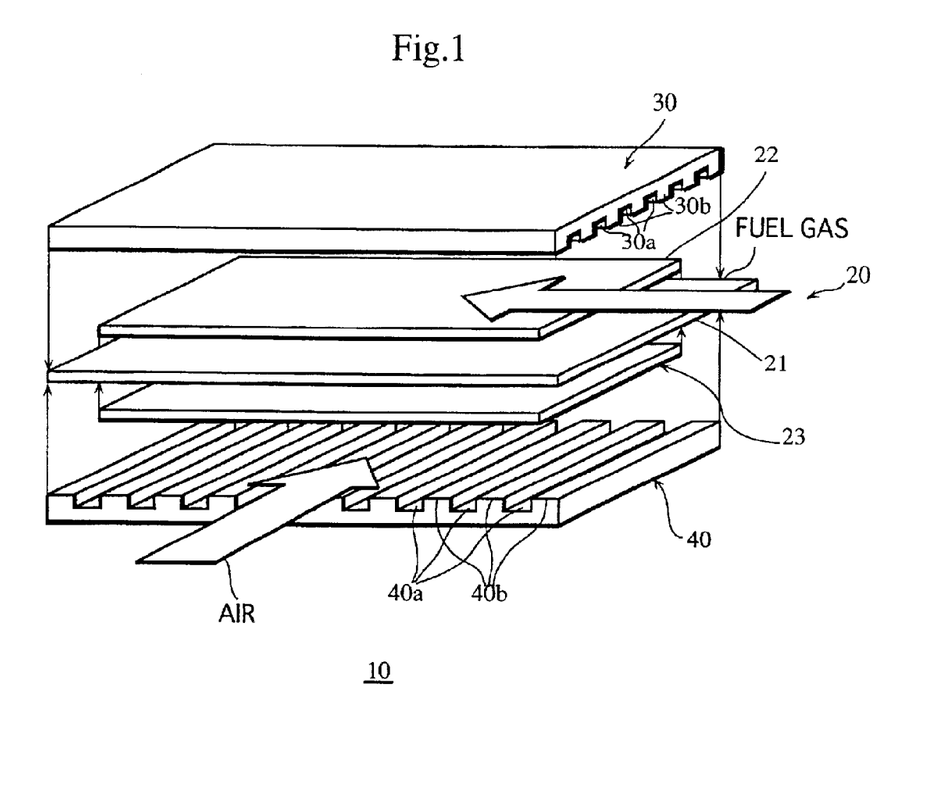
FIG. 1 is a perspective exploded view showing the main part of a polymer electrolyte fuel cell to which an embodiment of the invention relates.

The following describes a fuel cell separator used for a polymer electrolyte fuel cell, which is an embodiment of the present invention, with reference to the attached drawings.
(1) Cell Structure of Polymer Electrolyte Fuel Cell FIG. 1 is a perspective exploded view showing the main part of the polymer electrolyte fuel cell, which is a cell unit.

As shown herein, a cell unit 10 consists of a cell 20, an anode-side separator 30 and a cathode-side separator 40 that sandwich the cell 20.

The cell 20 consists of a solid polymer film 21, an anode 22 and a cathode 23. The anode 22 and the cathode 23 are arranged opposite to each other with the solid high polymer film 21 sandwiched in between.

The solid high polymer 21 is an electrolytic film made of an ion-exchange resin. The anode 22 and the cathode 23 are electrodes molded into the shape of a sheet, and contain carriers that support a precious metal catalyst.

The anode-side separator 30 has alternating anode-side channels 30a and anode-side ribs 30b on a main surface facing the anode 22. The cathode-side separator 40 has alternating cathode-side channels 40a and cathode-side ribs 40b, on a main surface facing the cathode 23.

Figure 2:
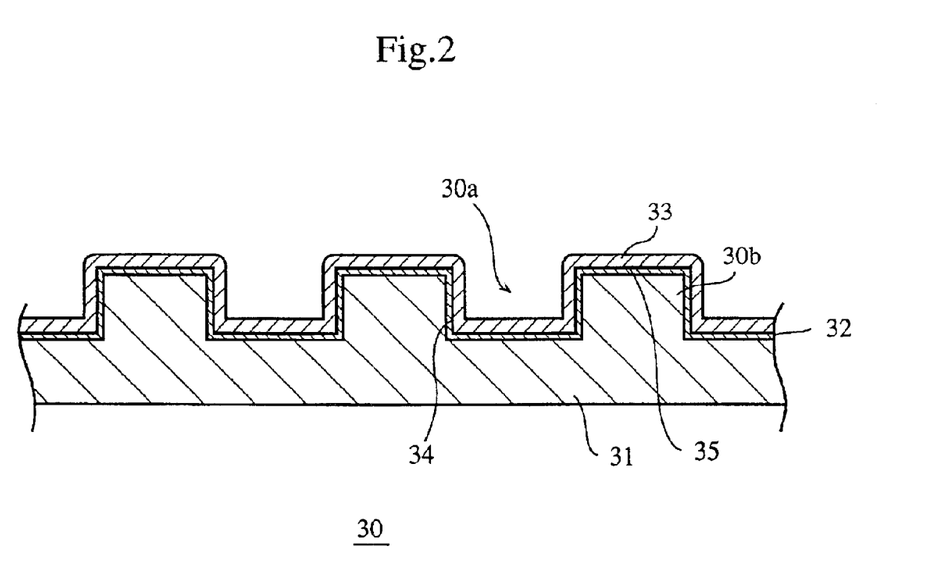
FIG. 2 is a sectional view of a separator facing an anode of the fuel cell.

FIG. 2 is a sectional view of the anode-side separator 30 taken along the width of the anode-side channels 30a. Since the cathode-side separator 40 has almost the same construction as the anode-side separator 30, the following explanation on the separator construction takes the anode-side separator 30 as an example.

As illustrated in FIG. 2, an intermediate layer 32 and a conductive layer 33 are formed on a main surface of the substrate 31 of anode-side separator 30 which has the alternating anode-side channels 30a and anode-side ribs 30b. The intermediate layer 32 and the conductive layer 33 are formed with a substantially uniform thickness across the inner surface 34 of the anode-side channels 30a and upper surfaces 35 of the anode-side ribs 30b. These layers improve water retentivity and hydrophilicity and reduce contact resistance. In an assembled cell unit 10 as shown in FIG. 1, the upper surfaces 35 of the anode-side ribs 30b are pressed against the anode 22.

When driving a fuel cell that is equipped with such a cell unit 10, a fuel gas is distributed through the anode-side channels 30a and air is distributed through the cathode-side channels 40a, as shown in FIG. 1. As a result, the hydrogen atoms in the fuel gas becomes protons ($H_2 \rightarrow 2H^+ + 2e^-$), and the protons migrate through the solid high polymer film 21 towards the cathode 23. At the cathode, oxygen from the gas on the cathode side reacts with the protons coming through the solid high polymer film 21, to produce water ($2H^+ + 1/2 O_2 + 2e^- \rightarrow H_2O$). As a result of this chemical reaction (a power generation reaction), the anode-side channels 30a and cathode-side channels 40a get wet with the resulting water and with humidifying water which is provided for the fuel gas.

(2) Structure of Separator Surface

Figure 3:
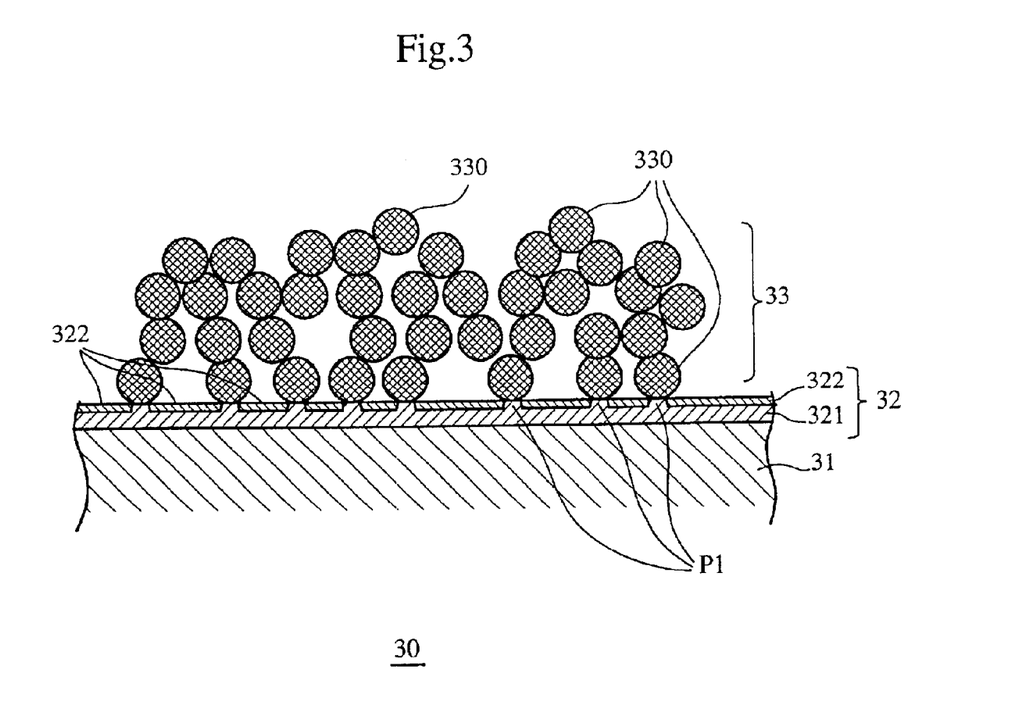
FIG. 3 is a sectional view of the surface of the separator facing the anode of the fuel cell.

FIG. 3 is an enlarged sectional view showing the surface facing the anode-side separator 30, including the anode-side channels 30a and the anode-side ribs 30b and its vicinity.

As shown herein, the anode-side separator 30 consists of the substrate 31, the intermediate layer 32 and the conductive layer 33. The intermediate layer 32 is formed on the surface of the substrate 31 facing the anode 22, and conductive particles 330 are laid randomly on the intermediate layer 32 to form the highly porous conductive layer 33. The intermediate layer 32 and the conductive particles 330 are fusion-bonded, and the conductive particles 330 are fusion-bonded with each other. Having such a construction, the conductive particles 330 are not easily peeled off.

The substrate 31 is made of a highly corrosion resisting material such as SUS 304 stainless steel and SUS 316 stainless steel, or a light-weighted material such as aluminum and aluminum alloy.

The intermediate layer 32 consists of a metal layer 321 and an oxide layer 322.

The metal layer 321 is made of a material that has a higher corrosion resistance than the substrate 31 when it is oxidized. The metal layer 321 is formed on the surface of the substrate 31 facing the anode 22 in the form of a film. It is preferable that the metal layer 321 is made of a material that has higher conductivity than the substrate 31 (e.g. Cr or Cr alloy containing no less than 20 wt % of Cr) to improve conductivity of the separator. It is also preferable that the metal layer 321 contains no less than 20 wt % of Cr and is made of an alloy containing a material whose conductivity is higher than that of the substrate 31 (e.g. at least one metal element selected from the group consisting of Ni, Ti, Nb, Au and Pt), to further improve conductivity of the separator.

The exposed parts of the surface of the metal layer 321, the parts where the conductive particles 330 are not fusion-bonded, are coated with an oxide layer 322 which is formed by oxidization.

The oxide layer 322 is made of an oxide that has a higher corrosion resistance than the substrate 31, such as chromic oxide. The exposed parts of the metal layer 321, the parts where no conductive particles 330 are fusion-bonded, are covered with this oxide layer 322.

The oxide layer 322 serves as a protective layer to prevent oxygen from permeating through the metal layer 321 and the substrate 31 and block the oxidation process in the metal layer 321 during the fuel cell operation. The oxide layer 322 may be provided either by oxidizing the metal layer 321 or by laminating a second metal oxide that has an excellent corrosion resistance, to prevent. It is preferable that the oxide layer 322 completely covers the exposed parts of the surface of the metal layer 321 to prevent oxygen diffusion, but this does not always have to be so. When the exposed parts are covered even partially, the progress of oxidation can be prevented at least in the covered portions. This increases corrosion resistance of the separator.

The conductive layer 33 is composed of the conductive particles 330 which are fusion-bonded with each other and with the metal layer 321. The conductive layer is highly porous and the pores are formed in such a complex manner that water is held in between the pores. This gives a separator high water retentivity and high hydrophilicity. Having high porosity is also effective in reducing contact resistance. In an assembled cell unit 10, the upper surfaces 35 of the anode-side ribs 30b (See FIG. 2) are pressed against the anode 22. This changes the form of the flexible sheet-like anode 22 to make the anode 22 more closely fitted to the conductive layer 33, reducing the contact resistance of the separator.

The conductive particles 330 are made of a transition metal. It is preferable that the transition metal has a higher conductivity than a material for the substrate 31 to reduce the contact resistance. Those materials include INCOLOY$^R$ 800 (a trademark of Huntington Alloy Canada Ltd., 33% Ni-21% Cr-45% Fe) and Ni—Mo steel (64% Ni-30% Mo). When the transition metal contains at least one element selected from the group consisting of Ni, Ti, Nb, Au and Pt, the conductivity of the separator increases, its electric resistance decreases, which in turn reduces contact resistance. The use of amorphous metals containing Cr will further improve the corrosion resistance. It is therefore preferable that the conductive particles 330 in the solid form are made of an amorphous metal containing Cr, rather than a crystal metal. In general, amorphous metals do not have asymmetrical structures such as grain boundary and dislocation, which are found in a crystal phase. This reduces a risk of having local chemical potential difference. The use of such amorphous metal therefore will improve the corrosion resistance of the conductive particles 330.

These conductive particles 330 are fusion-bonded directly to points P1, an interface where the conductive particles meet the metal layer 321. Due to the absence of an oxide layer at points P1, the resistance of the separator is kept at low in the direction of the thickness. If there was an oxide layer having a high electric resistance interposed in an electrical pathway between the conductive layer and the substrate, the electric resistance of the separator, when driving a fuel cell, would increase in the direction of the thickness. This would result in an increased voltage loss when a current is passed, which will degrade the performance of the fuel cell. However, the separator in this embodiment has no highly electric resisting oxide layer in the electric pathway, and therefore offers greater conductivity than one produced by the second conventional technique which has a corrosion resistant layer.

As explained above, the exposed parts of the metal layer 321 are covered with the film-like oxide layer 322. Such coverage suppresses the progress of oxidation in the metal layer 321, which increases the corrosion resistance of the separator.

Given the presence of oxygen and water during the fuel cell operation, the metal layer 321 may possibly suffer oxidation. Even in that case, however, the extent of the oxidation is still greater on the oxide layer 322 than at point P1 of the metal layer 321, an interface where the conductive particles 330 meet the metal layer 321. In other words, the oxidation progress more slowly at point P1 than on the oxide layer 322, since the point P1 is covered by the oxide layer 322 and the conductive particles 330 and is not so much exposed to oxygen. The metal layer 321 is therefore less likely to turn into an oxide which has a higher electric resistance. This gives the separator of the present invention low electric resistance in the direction of the thickness, low contact resistance and high corrosion resistance.

The conductive layer 33 is composed of the conductive particles 330, which are fusion-bonded, meaning that the conductive layer 33 is highly porous and has a water holding capacity. This ensures the solid high polymer film 21 and the anode 22 (cathode 23) get wet uniformly during the fuel cell operation.

It is preferable that the conductive layer 33 has a thickness ranging from 1 $\mu$m to 50 $\mu$m to provide a sufficient water holding capacity. Considering production efficiency and film deposition rate, it is more preferable that the conductive layer has a thickness range from 1 $\mu$m to 30 $\mu$m. Further, the conductive layer 33 should preferably be formed entirely on the surface of the substrate 31 facing the anode 22. But this does not have to be so, because even when the conductive layer 33 covers only the surfaces of the anode-side ribs 30b, the contact resistance of the anode can be reduced. Given the excellent conductivity and corrosion resistance of amorphous metals, it is preferable that all parts of the conductive particles 330 are made of an amorphous metal. But it does not matter if only some parts of the conductive layer 33, such as the surface of the conductive layer 33, are made of an amorphous metal. When the conductive layer 33 has a part that is functionally superior, the amorphous metals can still work effectively.

(3) Manufacturing Method for Fuel Cell Separator

Figure 4:
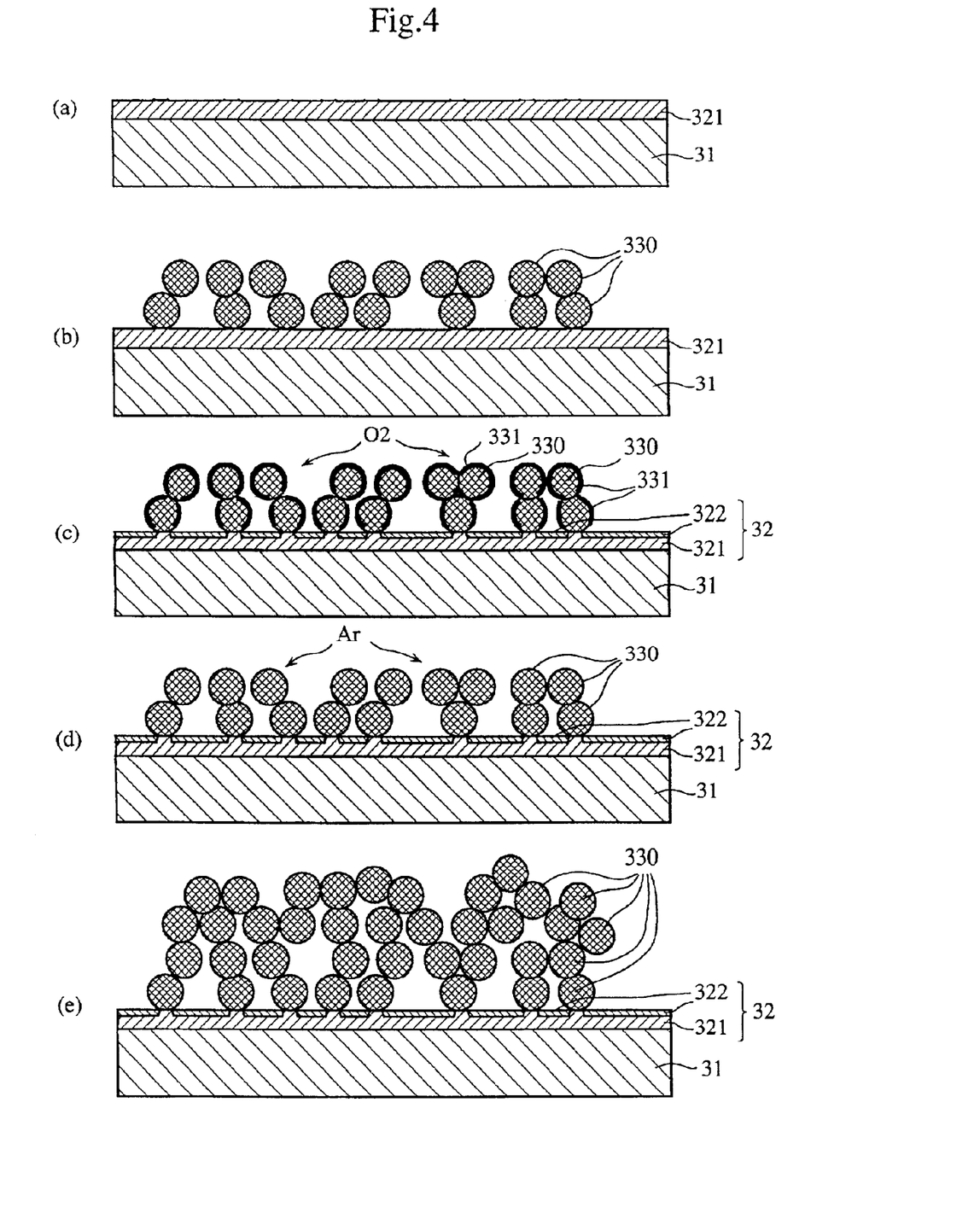
FIG. 4 shows how to manufacture the anode-side separator.

The following describes how to manufacture the anode-side separator 30, with reference to FIG. 4.

FIG. 4 are enlarged sectional views, taken from the side, showing the surface of the anode-side separator 30 facing the anode 22, including its vicinity. FIGS. 4(a) to (e) show the manufacturing steps in an ascending order.

① Metal Layer Forming Step

Firstly, an arc ion plating apparatus bombards the surface of the substrate 31 with an inert gas, such as Ar gas, at a predetermined bias voltage. In the collision, contaminants on the surface are blown off to clean the surface.

Then, as shown in FIG. 4(a), the metal layer 321 made of Cr is formed on the cleaned surface of the substrate 31 by physical vapor deposition, such as vacuum evaporation, sputtering, plasma spray coating and arc ion plating. By using such physical vapor deposition and adjusting conditions, it is possible to form a metal layer with a uniform thickness over a large area of an order of square centimeters. Above all, the arc ion plating can form films at a higher rate, so the use of the arc ion plating will form the Cr metal layer 321 in a short period of time at a predetermined bias voltage.

② Conductive Layer Forming Step

After the formation of the metal layer 321, as shown in FIG. 4(b), the conductive particles 330 are fusion-bonded to the metal layer 321 to form the conductive layer 33, though not completely. For the formation of the conductive layer 33, it is preferable to use physical vapor deposition. By ion-plating a target substance, which in this case is Cr, by means of the arc ion plating apparatus, the conductive layer 33 can be formed in a shorter period.

③ Oxidizing Step

Then, as shown in FIG. 4(c), the exposed surfaces of the metal layer 321 on the anode-side separator 30, on which the conductive particles 330 are fusion-bonded, are oxidized to form the oxide layer 322. In this process, the arc ion plating apparatus performs bombarding with oxygen gas, while applying a predetermined bias voltage. But this process forms the oxide layer 331 on the exposed surfaces of the conductive particles 330 as well.

④ Removing Step

To remove the oxide layer 332 and especially the oxide layer 331 from the surfaces of the conductive particles 330, as shown in FIG. 4(d), the arc ion plating apparatus bombards the layers with an inert gas, such as Ar, while a predetermined bias voltage is being applied.

As a result, the oxide layer 331 is removed from the surfaces of the conductive particles 330 while the oxide layer 322 remains as it is on the exposed surface of the metal layer 321, the parts of the surface where the conductive particles 330 are not adhered, as shown in FIG. 4(d). The selective removal of the oxide layer 331 is achieved probably because the inert gas (Ar) molecules attack the exposed areas of the conductive particles, which is the oxide layer 331. And the oxide layer 322 is not removed and remains there, probably because the complicated arrangement of the conductive particles 330 and the oxide layer 322 help keep the molecules of the bombarded inert gas (Ar) from arriving at the oxide layer 322.

⑤ Conductive Layer Screening Step

Finally, using the same technique as in the previous step, additional conductive particles 330 are laid on top of the existing conductive particles 330, as shown in FIG. 4(e) to form the conductive layer 33. This is done by the method that is used in the step for forming the conductive layer.

Though almost all of the oxides ought to be removed from the surfaces of the conductive particles 330 by the step for removing oxides, a little residue remain there in some cases. By adding conductive particles in layers, however, it is possible to suppress an increase in contact resistance caused by the presence of the oxide. Which is to say, if the residue of the oxide layer 331 remain on the surfaces of the conductive particles 330 in a fabricated cell unit, there might be an increase in contact resistance for the anode-side separator 30. However, by piling of the conductive particles 300, parts of the conductive particles 330 in the conductive layer 33 which come into contact with the anode in a fabricated separator remain unoxidized. The anode-side separator 30 has no highly electric resisting oxide layer in the contact area with the anode. This keeps a contact resistance of the separator at low.

Regarding the manufacture of the anode-side separator 30, it is preferable to form the conductive layer 33 first by bonding the conductive particles 330 to the surface of the substrate 31, and then form the anode-side channels 30a and anode-side ribs 30b (See FIG. 1) by press moulding. This enables to form the conductive layer 33 uniformly over the surface of the ribs 30b and inner surface of the channels. However, it is possible to make the anode-side separator 30 the other way. Which is to say, the process can start with the formation of the anode-side channels 30a and anode-side ribs 30b on the surface of the substrate 31, followed by the formation of the conductive layer 33.

(4) Testing

The following describes the outcome of a performance evaluation test. Actual example separators were made to evaluate the performance of the fuel cell separator related to the present invention. The actual examples were flat plate separators with the measurements of 50 mm×40 mm×2 mm.

ACTUAL EXAMPLE 1

Actual example 1 has a substrate which is a flat plate made of SUS316 steel, a metal layer made of Cr, and a conductive layer made of INCOLOY$^R$ 800.

Firstly, contaminants on the substrate were removed by metal bombardment (at a bias voltage of −600V×120s) using the arc ion plating apparatus.

After the bombardment, an intermediate layer was formed from Cr by arc ion plating (at a bias voltage of −30V×2880s).

Then, contaminants on the surface of the intermediate layer were removed by Ar bombardment (at a bias voltage of −600V×120s). Then, a conductive layer was formed, though incompletely, from INCOLOY$^R$ 800 by arc ion plating (at a bias voltage of −30V×600s).

Then, oxygen gas was put into the arc ion plating apparatus to be used for bombardment (at a bias voltage of −100V×60s), to oxidize exposed surfaces of the intermediate layer. This process also produces an oxide layer on the surfaces of the conductive particles. To remove this byproduct, Ar gas was put in to performing Ar bombardment (at a bias voltage of −600V×60s).

Finally, conductive particles made of INCOLOY$^R$ 800 were stacked one against another on top of the existing conductive particles to reach a predetermined height (at a bias voltage of −30V×6000s).

In the formed separator, an intermediate layer was formed on the conductive layer, and the conductive layer was formed on the surface of a substrate.

ACTUAL EXAMPLE 2

Actual example 2 was made in the same way as in the case of the actual example 1, except for a difference in composition of the conductive layer. The target substance used for a conductive layer of the actual example 2 was Ni—Mo steel (64% Ni-30% Mo). The conductive layer was formed by arc ion plating (at a bias voltage of −20V×300s for forming the conductive layer in the first half, and at a bias voltage of −20V×900s for piling up additional conductive particles).

COMPARISON EXAMPLE 1

This separator for evaluation used a flat plate made of SUS316 steel as a substrate. Both surfaces of the flat panel were oxidized.

COMPARISON EXAMPLE 2

This separator for evaluation used a flat plate made of SUS316 steel as a substrate. Both surfaces of the flat panel were oxidized and plated with Ni.

COMPARISON EXAMPLE 3

This separator for evaluation used a flat plate made of SUS316 steel as a substrate. Both surfaces of the flat panel were oxidized and plated with Ni and Au, in this order.

COMPARISON EXAMPLE 4

This separator for evaluation used a flat plate made of SUS316 steel as a substrate. The intermediate layer was formed only from chrome oxide. The target substance for the conductive layer was Ni—Mo steel (64% Ni-30% Mo).

Firstly, arc ion plating apparatus performs metal bombardment to remove contaminants from the surface of the substrate (at a bias voltage of −600V×120s). Then, arc ion plating using a Cr target substance was performed while oxygen gas was being put in. The result was an intermediate layer that was made purely of oxide chrome (at a bias voltage of −30V×2000s).

To remove the contaminants from the surface of the intermediate layer, Ar bombardment was performed on the substrate at a bias voltage of −600V×120s, the substrate on which the intermediate layer was formed. Then, a conductive layer was formed from Ni—Mo steel by arc ion plating (at a bias voltage of −20V×1200s), while Ar gas was being introduced.

The separator obtained by this process has an intermediate layer made only from oxide chrome.

[Test 1]

In this test, contact resistance of the actual examples 1 and 2 and the comparison examples 1 to 4 were measured for evaluation.

Figure 5:
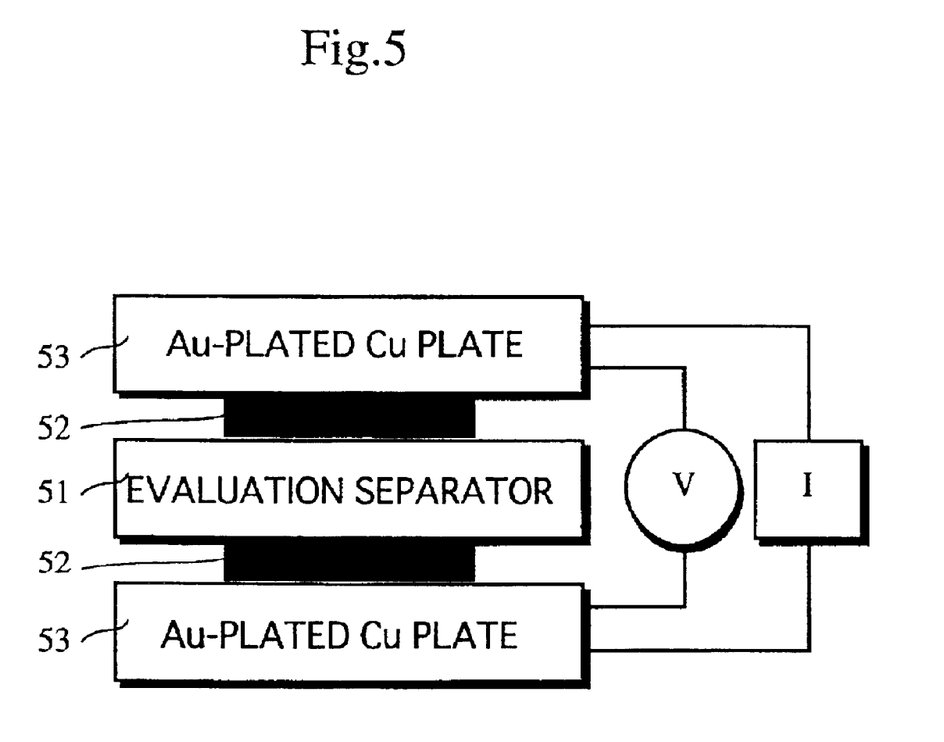
FIG. 5 shows how to measure contact resistance of an evaluation separator.

FIG. 5 shows the way of measuring the contact resistance for each actual and comparison examples.

As shown herein, an evaluation example 51, which represents the actual examples 1 and 2 and comparison examples 1 to 4, was sandwiched between two copper plates 53 with two carbon papers 52 (TGP-H060 manufactured by TORAY Industries Inc.) in-between. The surfaces of the copper plates 53 were plated with gold, and the carbon papers 52 were of a predetermined size.

A resistance value A of the separator 51 was measured by a commonly used alternate current four terminals method, when a clamping pressure was set at 30.5926×10-5 Pa (30 kgf/cm2). The two copper plates 53 were used as terminals. For comparison, a carbon paper 52 was sandwiched between the two copper plates 53, and a resistance value B was measured using the alternate current four terminals method when a clamping pressure was set at the same value. By subtracting the resistance value B and a total bulk resistance value C from the resistance value A, contact resistance between the surface of the separator 51 and the carbon paper was obtained. Here, the total bulk resistance value C refers to the sum of resistance values of those of the separator 51, carbon paper 52 and copper plates 53. The results are given in Table 1.

TABLE 1

| | Base Material | Intermediate Layer | Highly Conductive Layer | Contact Resistance (mΩ · cm$^2$) |
|---|---|---|---|---|
| Actual Example 1 | SUS316 | Cr and Cr Oxide | INCOLOY$^R$800 | 5 |
| Actual Example 2 | SUS316 | Cr and Cr Oxide | Ni/Mo | 3 |
| Comparison Example 1 | SUS316 | — | — | 30 |
| Comparison Example 2 | SUS316 | — | Ni-Plated | 3 |
| Comparison Example 3 | SUS316 | — | Ni- and Au-Plated | 2 |
| Comparison Example 4 | SUS316 | Cr Oxide | Ni/Mo | 25 |

From Table 1, it can be seen that the contact resistances of the actual examples 1 and 2 are much lower than those of the comparison examples 1 and 4, but equal to or slightly higher than those of the comparison examples 2 and 3 whose surfaces are plated with Ni. But the difference is not so large as to cause a problem for fuel cell applications.

[Test 2]

In this test, the actual examples 1 and 2 and comparison samples 1 to 4 were doped in ion-exchange water to see changes in their ion conductivity which is caused by ion diffusion. The extent of corrosion was evaluated for each separator based on observation under the microscope.

Prior to the test, ion-exchange water was prepared (150 ml, initial ion conductivity was 1 $\mu$S/cm) in a container covered with PTFE coating. The separators were put in the ion-exchange water so that they were half in water along the length. They had been doped in the ion-exchange water at 80° C. for 3000 hours, after which ion conductivity of the ion-exchange water was measured using an ion conductivity meter (Model SC82 manufactured by YOKOGAWA).

As a blank, ion-exchange water was put in the same type of container and its ion conductivity was measured after 3000 hours at a temperature of 80° C. The results are given in Table 2.

TABLE 2

| | Base Material | Intermediate Layer | Highly Conductive Layer | Observation Under Microscope | Ion Conductance ($\mu$/cm) |
|---|---|---|---|---|---|
| Actual Sample 1 | SUS316 | Cr and Cr Oxide | INCOLOY$^R$800 | No External Change | 7 |
| Actual Sample 2 | SUS316 | Cr and Cr Oxide | Ni/Mo | No External Change | 10 |
| Comparison Sample 1 | SUS316 | — | — | No External Change | 20 |
| Comparison Sample 2 | SUS316 | — | Ni-Plated | Corrosion | — |
| Comparison Sample 3 | SUS316 | — | Ni- and Au-Plated | Corrosion | — |

TABLE 2-continued

| | Base Material | Intermediate Layer | Highly Conductive Layer | Observation Under Microscope | Ion Conductance ($\mu$/cm) |
|---|---|---|---|---|---|
| Comparison Sample 4 | SUS316 | Cr Oxide | Ni/Mo | No External Change | 10 |
| Blank | SUS316 | — | — | — | 1→7 (in 3000 hours) |

From Table 2, it can be seen under the microscope that the pinholes were corroded in the comparison samples 2 and 3. Since the metal layer is formed through plating, it is inevitable that these pinholes occur, and the pinholes suffer corrosion.

Although the external change of the comparison sample 1 was not observed, given the increase in ion conductivity to 20 $\mu$S/cm, it is assumed that corrosion had been built up in the comparison sample 1.

Since the external change of the comparison sample 4 was not observed and its ion conductivity remained high, it is assumed that the comparison sample 4 was free from corrosion. On the other hand, the comparison sample 4 shows a low contact resistance as demonstrated in test 1.

By contrast, it seems that the actual examples 1 and 2 in this embodiment were not undermined by corrosion. There was no change in their external appearance, and their ion conductivity are almost equal to that of the blank (7 $\mu$S/cm).

Judging from the outcomes of tests 1 and 2, it is assumed that the actual examples 1 and 2 have both high conductivity and corrosion resistance. They showed such high conductivity because the conductive layers and metal layers with excellent conductivity were bonded together, without any oxide layers in between. The actual examples 1 and 2 showed such high corrosion resistance, probably because the exposed parts of the surfaces of the metal layers were coated with oxide layers having high corrosion resistance. This means that fuel cells using the separators of the above embodiments will have so high conductivity and high corrosion resistance, that they will suffer less voltage loss, and at the same time, continuously provide stable supply of electric voltage.

Figure 6:
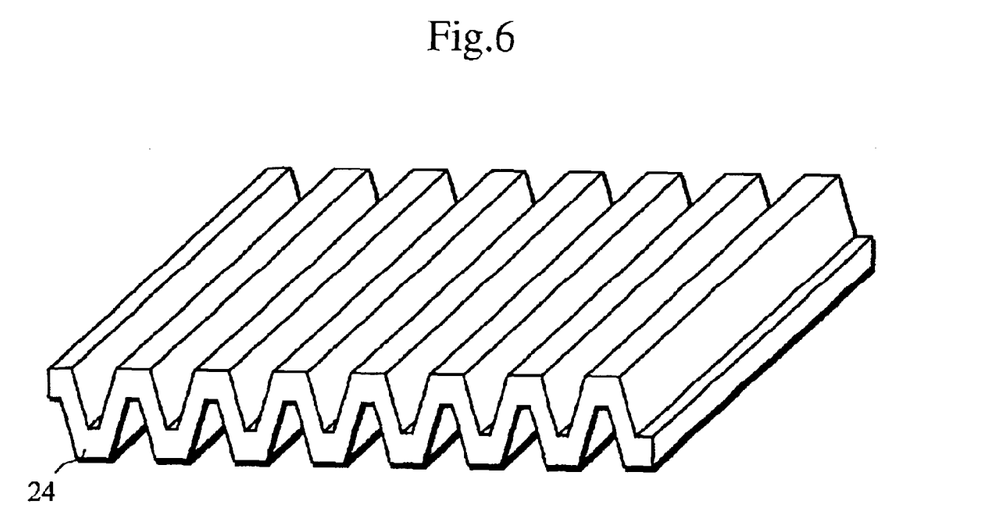
FIG. 6 is a perspective view showing an example shape of a separator.

In the above description about the cell unit 10, the channels 30a of the anode-side separator 22 and channels 40a of the cathode-side separator 23 were formed on one of the surfaces of the substrates, as shown in FIG. 1. However, the conductive layer and the channels may be formed on both surfaces of the separator 24 that has a wave-form sectional view, as shown in FIG. 6, by using such a bipolar plate, the number of elements of a separator in a fabricated fuel cell can be reduced in which the cell units are stacked one against another. This is also effective in reducing the thickness of the separator. The separator 24 can be obtained by forming conductive layers on both surfaces of a thin flat substrate and pressing the substrate into a wave form.

Although the above embodiment describes the use of the separator of the present invention only for a polymer electrolyte fuel cell, the separator is applicable for any types of fuel cells that operate at temperatures as low as 500° C. or below. These fuel cells include direct methanol fuel cells and phosphate fuel cells. Used in such fuel cells, the separator of the present invention can offer high corrosion resistance and conductivity (low contact resistance). This enables the fuel cells to suffer less electric voltage loss and operate longer and stably.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A fuel cell separator that has a substrate made of a first metal, comprising:
    a metal layer formed on a surface of the substrate, the metal layer being made of a second metal that is different from the first metal in composition;
    a conductive porous layer formed on a surface of the metal layer, the conductive porous layer being made up of a plurality of conductive particles composed of transition metals which are fusion-bonded to each other; and
    an oxide film formed on parts of the surface of the metal layer that do not come into contact with the conductive particles, the oxide film having a higher corrosion resistance than the substrate.

2. The fuel cell separator of claim 1,
    wherein the oxide film is formed by oxidizing the metal layer, so that the oxide film is oxidized by a greater degree than a surface of the metal layer at an interface between the conductive particles and the metal layer.

3. The fuel cell separator of claim 1,
    wherein the metal layer is made of a material that has a higher conductivity than the substrate.

4. The fuel cell separator of claim 1,
    wherein the conductive porous layer is made of a material that has a higher conductivity than the substrate.

5. The fuel cell separator of claim 4,
    wherein ribs and channels are formed on at least one principal surface of the substrate, and the conductive porous layer is adhered to upper surfaces of the ribs.

6. The fuel cell separator of claim 1,
    wherein the first metal is selected from the group consisting of stainless steel, aluminum and aluminum alloy.

7. The fuel cell separator of claim 1,
    wherein the second metal is one of Cr and a Cr alloy containing at least 20 wt % of Cr.

8. The fuel cell separator of claim 7,
    wherein the Cr alloy contains at least one element selected from the group consisting of Ni, Ti, Nb, Au and Pt.

9. The fuel cell separator of claim 1,
    wherein the conductive porous layer is made of a metal containing at least one element selected from the group consisting of Ni, Ti, Nb, Au and Pt.

10. A fuel cell having an anode on one surface of an electrolytic film, a cathode on a remaining surface of the electrolytic film, a separator being opposed to the anode, and a separator being opposed to the cathode, wherein the fuel cell generates power from a fuel and an oxidizer when the fuel is distributed along a surface of the separator facing the anode and the oxidizer is distributed along a surface of the separator facing the cathode, wherein the separator is the fuel cell separator of claim 1.

11. A manufacturing method for a fuel cell separator having a metal substrate, comprising:

a metal layer forming step for forming a metal layer on a surface of the substrate, the metal layer serving as an oxide film that has a higher corrosion resistance than the substrate;

a conductive layer forming step for forming a porous conductive layer on a surface of the metal layer, the porous conductive layer being made up of a plurality of conductive particles composed of transition metals which are fusion-bonded to each other, the plurality of conductive particles having a higher conductivity than the substrate;

an oxidizing step for oxidizing exposed parts of the surfaces of the metal layer and the conductive particles; and a removing step for removing oxides from the exposed parts of the surfaces of the conductive particles.

12. The manufacturing method of claim 11, wherein the metal layer forming step produces the metal layer by physical vapor deposition.

13. The manufacturing method of claim 12, wherein a target substance used for the physical vapor deposition has a higher corrosion resistance than the substrate when it is oxidized.

14. The manufacturing method of claim 12, wherein the physical vapor deposition is an arc ion plating method.

15. The manufacturing method of claim 11, wherein the conductive layer forming step produces the porous conductive layer by physical vapor deposition.

16. The manufacturing method of claim 11, wherein the removing step includes the usage of an arc ion plating apparatus to remove the oxides by performing bombardment with an inert gas.

* * * * *